United States Patent [19]
Novak

[11] Patent Number: 5,760,564
[45] Date of Patent: Jun. 2, 1998

[54] DUAL GUIDE BEAM STAGE MECHANISM WITH YAW CONTROL

[75] Inventor: W. Thomas Novak, Hillsborough, Calif.

[73] Assignee: Nikon Precision Inc., Belmont, Calif.

[21] Appl. No.: 495,044

[22] Filed: Jun. 27, 1995

[51] Int. Cl.$^6$ ............................................. G05B 11/00
[52] U.S. Cl. .................... 318/687; 318/67; 318/38; 318/135; 384/12; 269/55
[58] Field of Search ........................ 318/67, 687, 38, 318/135; 384/12, 225, 428; 269/55, 82, 83

[56] References Cited

U.S. PATENT DOCUMENTS

| | | | |
|---|---|---|---|
| Re. 27,289 | 2/1972 | Sawyer | 318/38 |
| Re. 27,436 | 7/1972 | Sawyer | 346/29 |
| 3,789,285 | 1/1974 | Nishizawa | 318/687 |
| 3,889,164 | 6/1975 | Nishizawa et al. | 318/640 |
| 3,935,486 | 1/1976 | Nagashima | 310/12 |
| 4,019,109 | 4/1977 | McCoy et al. | 318/640 |
| 4,058,843 | 11/1977 | Gyi | 384/12 X |
| 4,087,729 | 5/1978 | Yamazaki et al. | 318/601 |
| 4,129,291 | 12/1978 | Kato et al. | 269/73 |
| 4,234,175 | 11/1980 | Sato et al. | 269/73 |
| 4,392,642 | 7/1983 | Chitayat | 269/73 |
| 4,409,860 | 10/1983 | Moriyama et al. | 74/479 |
| 4,425,508 | 1/1984 | Lewis, Jr. et al. | 250/442.1 |
| 4,443,743 | 4/1984 | Forys et al. | 318/115 |
| 4,485,339 | 11/1984 | Trost | 318/640 |
| 4,492,356 | 1/1985 | Taniguchi et al. | 248/346 |
| 4,504,144 | 3/1985 | Trost | 356/150 |
| 4,506,204 | 3/1985 | Galburt | 318/653 |
| 4,506,205 | 3/1985 | Trost et al. | 318/653 |
| 4,507,597 | 3/1985 | Trost | 318/653 |
| 4,514,858 | 4/1985 | Novak | 378/34 |
| 4,516,253 | 5/1985 | Novak | 378/34 |
| 4,525,659 | 6/1985 | Imahashi et al. | 318/649 |
| 4,560,014 | 12/1985 | Geczy | 384/225 X |
| 4,575,942 | 3/1986 | Moriyama | 33/1 M |
| 4,607,167 | 8/1986 | Petric | 384/12 X |
| 4,615,515 | 10/1986 | Suzuta et al. | 269/73 |
| 4,628,238 | 12/1986 | Smulders et al. | 318/653 |
| 4,630,942 | 12/1986 | Tsumaki et al. | 384/8 |
| 4,641,071 | 2/1987 | Tazawa et al. | 318/640 |
| 4,648,723 | 3/1987 | Sugiyama et al. | 384/9 |
| 4,648,724 | 3/1987 | Sugiyama et al. | 384/9 |
| 4,653,408 | 3/1987 | Nagashima et al. | 108/20 |
| 4,654,571 | 3/1987 | Hinds | 318/687 |
| 4,667,139 | 5/1987 | Hirai et al. | 318/687 |
| 4,675,891 | 6/1987 | Plessis et al. | 378/132 |
| 4,677,651 | 6/1987 | Hartl et al. | 378/132 |
| 4,684,315 | 8/1987 | Sugishima et al. | 414/749 |
| 4,687,980 | 8/1987 | Phillips et al. | 318/340 |
| 4,698,575 | 10/1987 | Bouwer | 318/340 |
| 4,708,465 | 11/1987 | Isohata et al. | 355/53 |

(List continued on next page.)

FOREIGN PATENT DOCUMENTS 63-20014  1/1988  Japan.

OTHER PUBLICATIONS

Moriyama, et al., "*Precision X-Y State with a Piezo-driven Fine-table,*" The bulletin of The Japan Society Precision Engineering, vol. 22, No. 1, pp 13–17, Mar. 1988.

*Primary Examiner*—Karen Masih
*Attorney, Agent, or Firm*—Skjerven, Morrill, Macpherson, Franlin & Friel; Norman R. Klivans

[57] ABSTRACT

A dual guide beam stage mechanism for accurate X-Y positioning for use e.g. in semiconductor processing equipment provides accurate planar motion and yaw control. Over-constraint between components in their relative motion is minimized by utilizing flexibly mounted air bearings at the connection between at least one of the moveable guide beams and its corresponding stationary guide, and between at least one of the guide beams and the adjacent stage itself. Thus stage yaw motion is provided by allowing yaw motion of one of the guide beams. Preloading provides enough constraint through the air bearings without over-constraining the moving components, thereby improving accuracy and also reducing the need for close manufacturing tolerances.

14 Claims, 4 Drawing Sheets

U.S. PATENT DOCUMENTS

| | | | |
|---|---|---|---|
| 4,723,086 | 2/1988 | Leibovich et al. | 310/328 |
| 4,742,286 | 5/1988 | Phillips | 318/640 |
| 4,744,675 | 5/1988 | Sakino et al. | 384/12 |
| 4,750,721 | 6/1988 | Sasada | 269/73 |
| 4,770,531 | 9/1988 | Tanaka et al. | 356/358 |
| 4,812,725 | 3/1989 | Chitayat | 318/625 |
| 4,817,930 | 4/1989 | Van Deuren | 269/73 |
| 4,870,668 | 9/1989 | Frankel et al. | 378/34 |
| 4,887,804 | 12/1989 | Ohtsuka | 269/73 |
| 4,916,340 | 4/1990 | Negishi | 310/12 |
| 4,952,858 | 8/1990 | Galburt | 318/647 |
| 4,993,696 | 2/1991 | Furukawa et al. | 269/73 |
| 5,022,619 | 6/1991 | Mamada | 248/178 |
| 5,040,431 | 8/1991 | Sakino et al. | 74/479 |
| 5,059,090 | 10/1991 | Bobroff et al. | 414/749 |
| 5,120,034 | 6/1992 | Van Engelen et al. | 269/73 |
| 5,150,153 | 9/1992 | Franken et al. | 355/53 |
| 5,228,358 | 7/1993 | Sakino et al. | 74/479 R |
| 5,241,183 | 8/1993 | Kanai et al. | 250/453.11 |
| 5,243,491 | 9/1993 | Van Eijk et al. | 361/144 |
| 5,280,677 | 1/1994 | Kubo et al. | 33/568 |
| 5,285,142 | 2/1994 | Galburt et al. | 318/640 |
| 5,327,060 | 7/1994 | Van Engelen et al. | 318/640 |

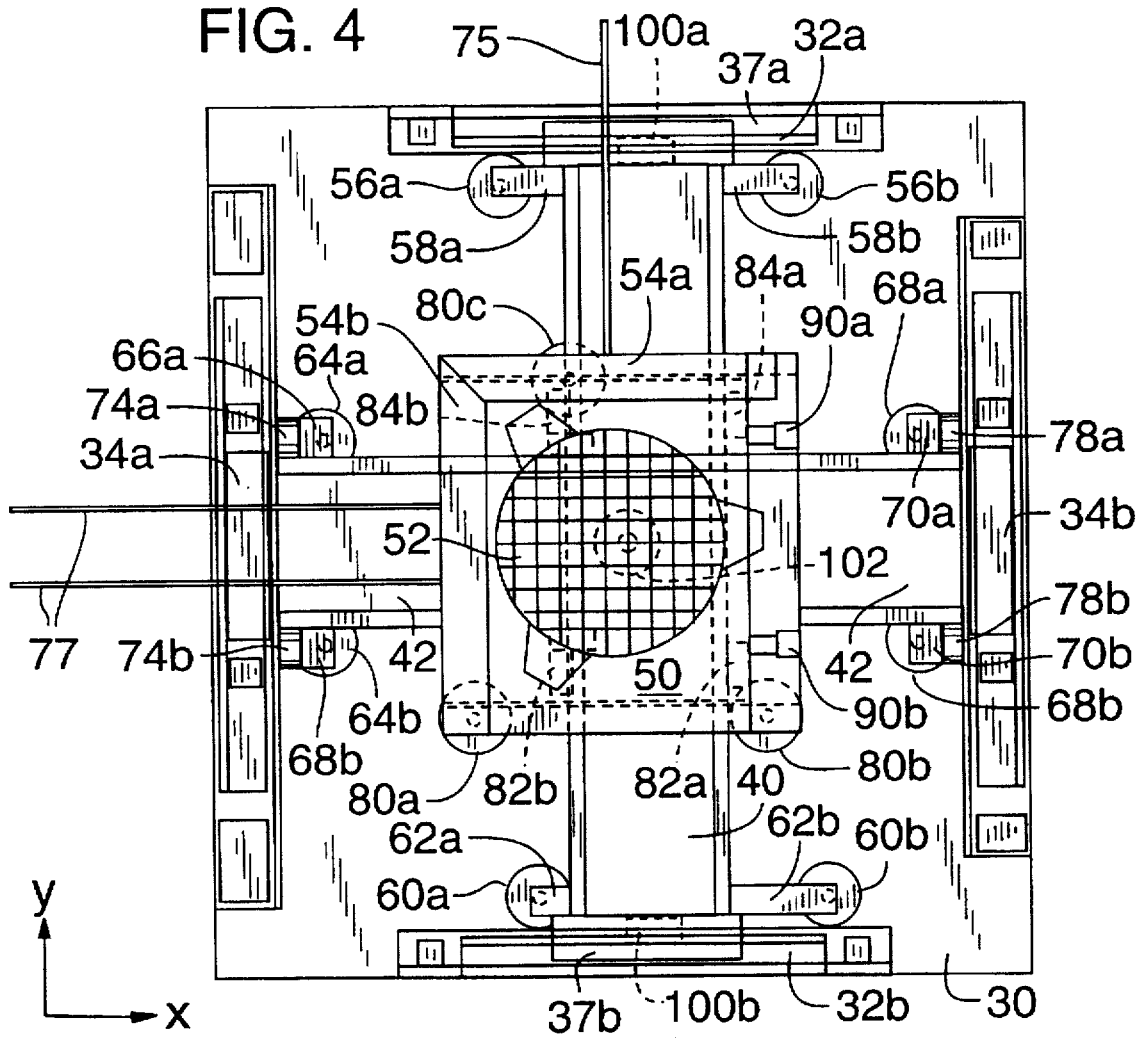

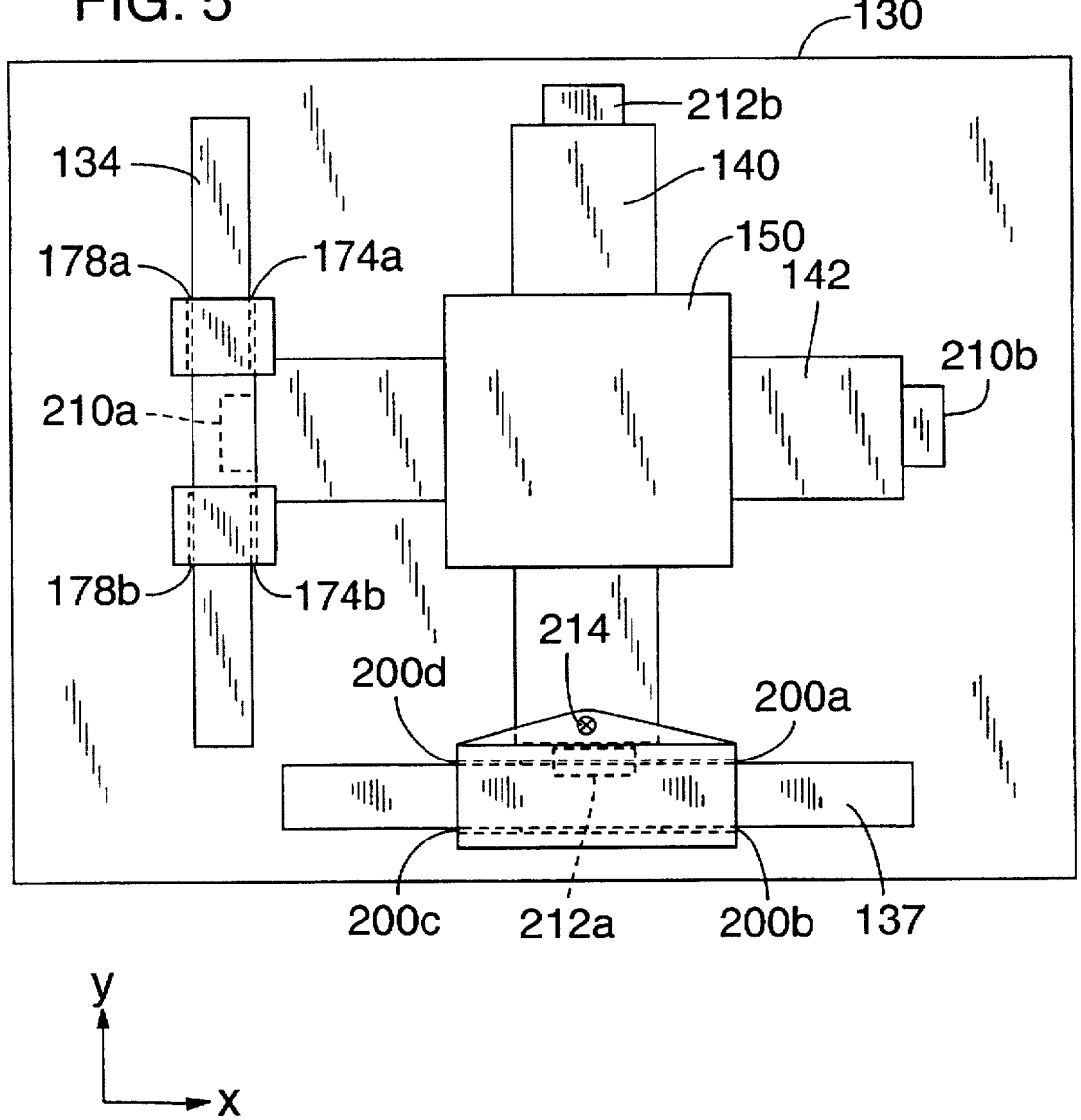

DUAL GUIDE BEAM STAGE MECHANISM WITH YAW CONTROL

BACKGROUND OF THE INVENTION

1. Field of the Invention

This invention relates to stages for precision movement and location, such as used in precision machines including semiconductor photolithography equipment. More specifically, the invention relates to a stage mechanism having two guide beams with accurate planar motion and yaw control.

2. Description of the Prior Art

Mechanical positioning devices are well known; one type called a stage provides motion in two horizontal dimensions (X and Y directions) with also some limited motion in the vertical dimension (Z direction). The stage typically holds a workpiece. Examples of stages are disclosed in "Static Pressure Air Surface Stage", U.S. Pat. No. 4,648,723 issued Mar. 10, 1987 and "Static Pressure Air Surface Stage", U.S. Pat. No. 4,648,724 issued Mar. 10, 1987. Present FIG. 1 is identical to FIG. 1 of U.S. Pat. No. 4,648,724 and in a plan view includes a moveable guide 13 for guiding movement of a stage 12 in the X axis direction and a moveable guide 14 for guiding movement of the stage 12 in the Y axis direction. Both guides 13, 14 are disposed on a surface plate 11. Four pairs of bearing pads 17, 17, 17, 17; 18, 18, 18, 18 are disposed oppositely on the inner and outer surfaces of the stationary guides 15, 15 and 16, 16 which are disposed at both end portions of the respective moveable guides 13 and 14.

Thus the pairs of bearing pads hold the moveable guides with a firm grip on the stationary guides. Linear motors located at the ends of the movable guides provide low friction movement of the guides relative to the stationary guides. Thus each movable guide is constrained to move precisely in one degree of freedom only. Disadvantageously, this apparatus does not provide any yaw direction motion of the movable guides.

Additionally, this apparatus has been found by the present inventors to be over-constrained. Over-constraint arises when there is any e.g. thermal expansion of either of the movable guides or any deviation from perfect parallelism of the oppositely situated stationary guides. Especially, the apparatus of FIG. 1 is over-constrained due to the stationary guides being gripped on each side by the movable guide bearings. Such an over-constrained system has been found to require very close tolerances during fabrication, or inaccuracies in operation undesirably result.

There is similar lack of yaw motion and over-constraint in this prior art at the connection between the stage 12 and the moveable guides 13 and 14. In the apparatus of FIG. 1, each movable guide has two bearing pads on each side which transmit forces that drive the stage 12 and provide low friction motion between the stage and the movable guides. Above-referenced U.S. Pat. No. 4,648,723 discloses a system that stabilizes and improves the precision motion of the stage. Again, this undesirably causes over-constraint in the event of any expansion of the components or any deviation from perfect alignment of the movable guides with the stage. Further, the highly constrained condition between the various components makes it difficult for the stage to move in the yaw direction i.e. to rotate about the Z axis (the axis perpendicular to the surface of the paper in the plan view of FIG. 1).

SUMMARY OF THE INVENTION

In accordance with the invention, a stage mechanism includes two movable orthogonal guide beams, each in contact with at least one fixed guide, to guide the motion of a stage and provide accurate planar motion and also yaw control. Stage yaw motion is provided by allowing yaw motion of one guide beam. The above-described prior art using the dual movable guide structure does not allow this yaw motion.

In addition, this prior art mechanism is over constrained. Any over-constraint condition between components is minimized in accordance with the present arrangement by an arrangement of fluid bearings and bearing mounts at the connections between the movable guide beams and the corresponding stationary guides, and also at the connection between the guide beams and the stage. This bearing arrangement uses pre-loading to provide just enough constraint through the bearings, without over-constraining the moving components, thereby reducing inaccuracies and eliminating the need for manufacturing tolerances.

In accordance with the invention, a first guide beam is constrained to move in a linear direction and transfers that linear motion to the stage. The second guide beam is constrained to move orthogonally to the first guide beam and also allowed to move slightly in a yaw direction. The second guide beam couples a motion in these two degrees of freedom and transfers it to the stage. Advantageously this mechanism uses simple fluid (e.g. air) bearings and bearing mounts and is relatively inexpensive to manufacture due to reduced tolerances, while maintaining high performance.

In one embodiment where the guide beams each are in contact with two spaced apart and parallel guides, a single non-contact, e.g. fluid, bearing is mounted at each end of the second guide beam. At one end of the second guide beam the bearing is spring mounted to the guide beam. At the other end of the second guide beam the bearing is fixedly mounted. The first guide beam, orthogonal to the second, has two bearings at each end to reduce yaw. The forces on the second guide beam are relatively unchanged even if the stationary guides are not perfectly parallel. Further, the total distortion on each guide beam caused by the forces of the bearings on its ends are minimized by using guide beams of high rigidity material and having a cross-section optimized for rigidity in the drive direction. Additionally, the bearings are located as close to the neutral axis of each guide beam as practical. The minimum force required to stabilize each guide beam is employed in pre-loading of the bearings.

Additionally, the constraints between the two guide beams and the stage similarly include spring mounted non-contact bearings in order to make the stage insensitive to motion of the first (X direction) guide beam in the Z and Y directions and to motion of the second (Y direction) guide beam in the X and Z directions. Thus advantageously any over-constraint between the two guide beams and their stationary guides and between the two guide beams and the stage is minimized, without compromising the performance of the overall stage mechanism.

This stage mechanism is especially advantageous for applications such as scanning photolithography where the stage holds a semiconductor wafer which is being scanned by a photolithography machine. Additionally, fine yaw control of the stage is achieved by differentially driving the two motors of the guide beam which controls the yaw motion.

BRIEF DESCRIPTION OF THE DRAWINGS

FIG. 4 shows an "x-ray" plan view showing all the air bearings of the mechanism of FIGS. 2 and 3.

FIG. 5 shows a plan view of a stage mechanism in accordance with a second embodiment of the present invention.

DETAILED DESCRIPTION OF THE INVENTION

Figure 2:
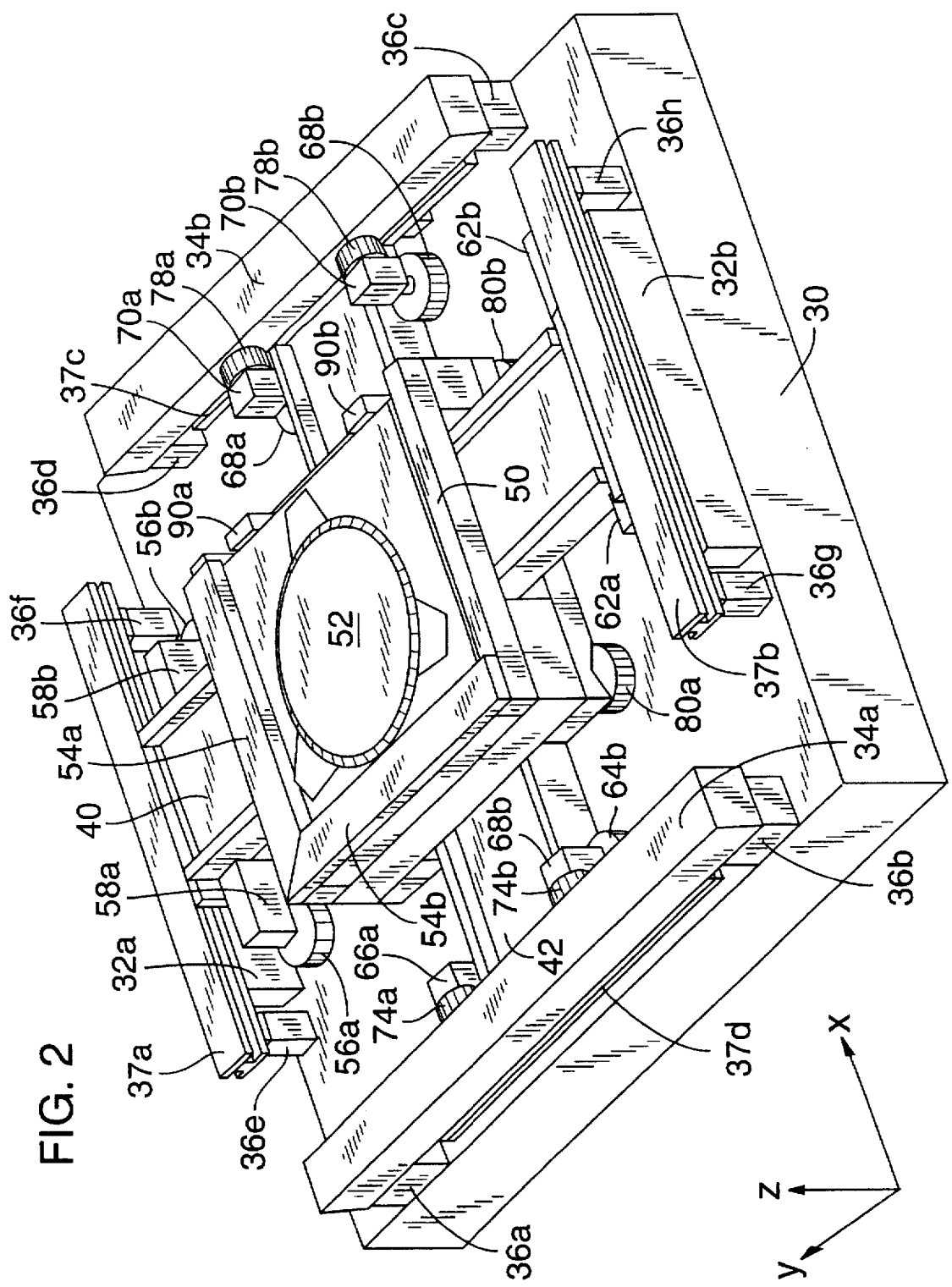
FIG. 2 shows a perspective view of a stage mechanism in accordance with the present invention.

FIG. 2 is a perspective view of a stage mechanism in one embodiment of the invention. Two pairs of stationary guides, the first pair being 32a, 32b and the second pair being 34a, 34b are mounted on planar base 30. It is to be understood that the stationary guides may be an integral part of the base (for instance, be the sides of the base). Parallel stationary guides 32a, 32b guide the X guide beam 40 (so called because it moves in the X-axis direction and only part of which is visible since the remaining portion is covered by stage 50 ). Similarly, parallel stationary guides 34a, 34b guide the Y guide beam 42 (so called because it moves in the Y-axis direction and again only a portion of which is visible). (The X, Y, and Z axes are illustrated in the lower left portion of FIG. 2). There is no requirement that the two directions of motion be perpendicular, so alternatively the two sets of stationary guides are at an angle to one another less (or more) than 90°.

The stationary guides 34a, 34b in this embodiment are mounted respectively on supports 36a, 36b, 36c, 36d, and magnetic tracks 37a, 37b are mounted respectively on supports 36e, 36f, 36g, 36h.

One linear motor coil assembly (not visible in FIG. 2) is mounted at each end of both guide beams 40 and 42. These four linear motor coil assemblies drive the guide beams 40, 42 along the corresponding magnetic tracks 37a, 37b, 37c, 37d. These motor coil assemblies and magnetic tracks may be of a commercially available type. For instance, the linear motor coils may be part number LM310-5 from Trilogy Company and the magnetic tracks may also be from Trilogy Company. (The control system for and provision of power to these linear motor coil assemblies is conventional and is not further described. A description of a conventional control system is found in commonly owned and invented patent application Ser. No. 08/325,740, filed Oct. 19, 1994, entitled "Precision Motion Stage with Single Guide Beam and Follower Stage", now U.S. Pat. No. 5,623,853, issued on Apr. 29, 1997, incorporated by reference.)

Stage 50 holds a conventional circular vacuum chuck 52 used for holding a semiconductor wafer (which is the work piece). Also located on stage 50 are two interferometer mirrors 54a, 54b which are conventionally used for location of the stage 50 by impinging lasers beams, as described further below. Stage 50 is of a size in one embodiment to hold a 12" diameter semiconductor wafer.

The X guide beam 40, Y guide beam 42 and stage 50 are each supported on the upper planar surface of conventional base 30 by non-direct contact (low friction) bearings mounted on their undersides. Air bearings as used herein may be of conventional commercially available type. A typical separation between the working surface of each air bearing and the opposing base 30 surface on which the air bearing slides is 5 to 10 microns when the air bearing is operating.

Only some of the air bearings are shown in the perspective view of FIG. 2, others not being visible due to the nature of the drawing. For instance, as shown in FIG. 2, the X guide beam 40 is supported on base 30 at its upper end (in the drawing) by air bearing 56a to the left and air bearing 56b to the right. Air bearing 56a is mounted on a support 58a attaching to guide beam 40 and air bearing 56b is mounted on a support 58b attaching to guide beam 40. Supports 58a, 58b are approximately 100 millimeters long and space the air bearings away from the X guide beam 40, so as not to interfere with other air bearings supporting stage 50. The air bearings at the other end of X guide beam 40 are not visible; however the corresponding supports 62a, 62b (also for clearance) are depicted.

Referring to guide beam 42, at its left hand side, air bearing 64b is mounted on support 66b and there is also support 66a, the associated air bearing not being visible. At the right hand side of the Y guide beam 42 air bearing 68a is mounted on support 70a which is approximately 40 millimeters long and air bearing 68b is on support 70b which is also approximately 40 millimeters long. (It is to be understood that these and other dimensions herein are illustrative and not limiting.)

Two air bearings 80a, 80b are shown for support of stage 50. A third air bearing 80c (not visible) supporting stage 50 is described below.

Additionally, the X guide beam 40 and Y guide beam 42 are each slidably supported against the opposing surfaces of the stationary guides 32a, 32b, 34a, 34b by air bearings. In the view of FIG. 2 only these air bearings for Y guide beam 42 are shown; air bearing 74a is mounted on support 66a and air bearing 74b is mounted on support 66b. On the right hand side of Y guide beam 42, bearings 78a and 78b respectively are mounted on supports 70a, 70b.

Figure 1:
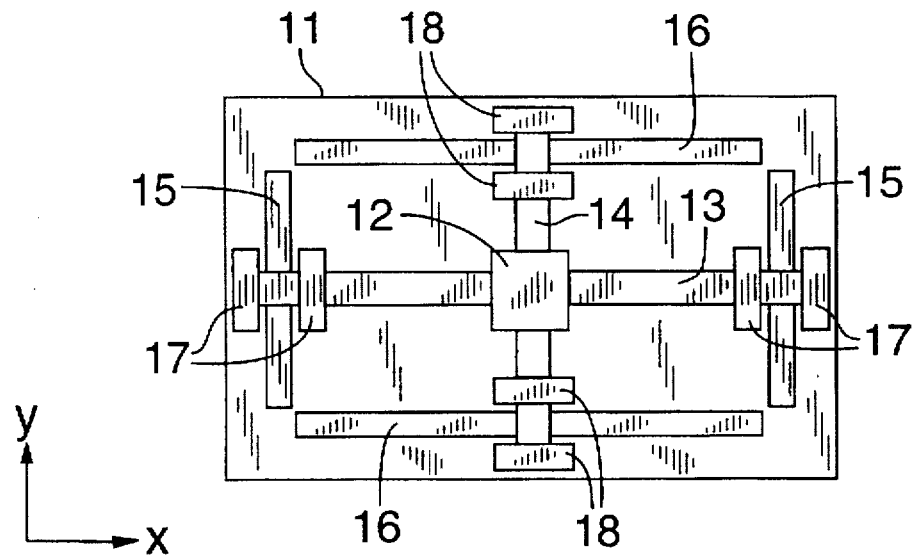
FIG. 1 shows a plan view of a prior art stage mechanism.
Figure 3:
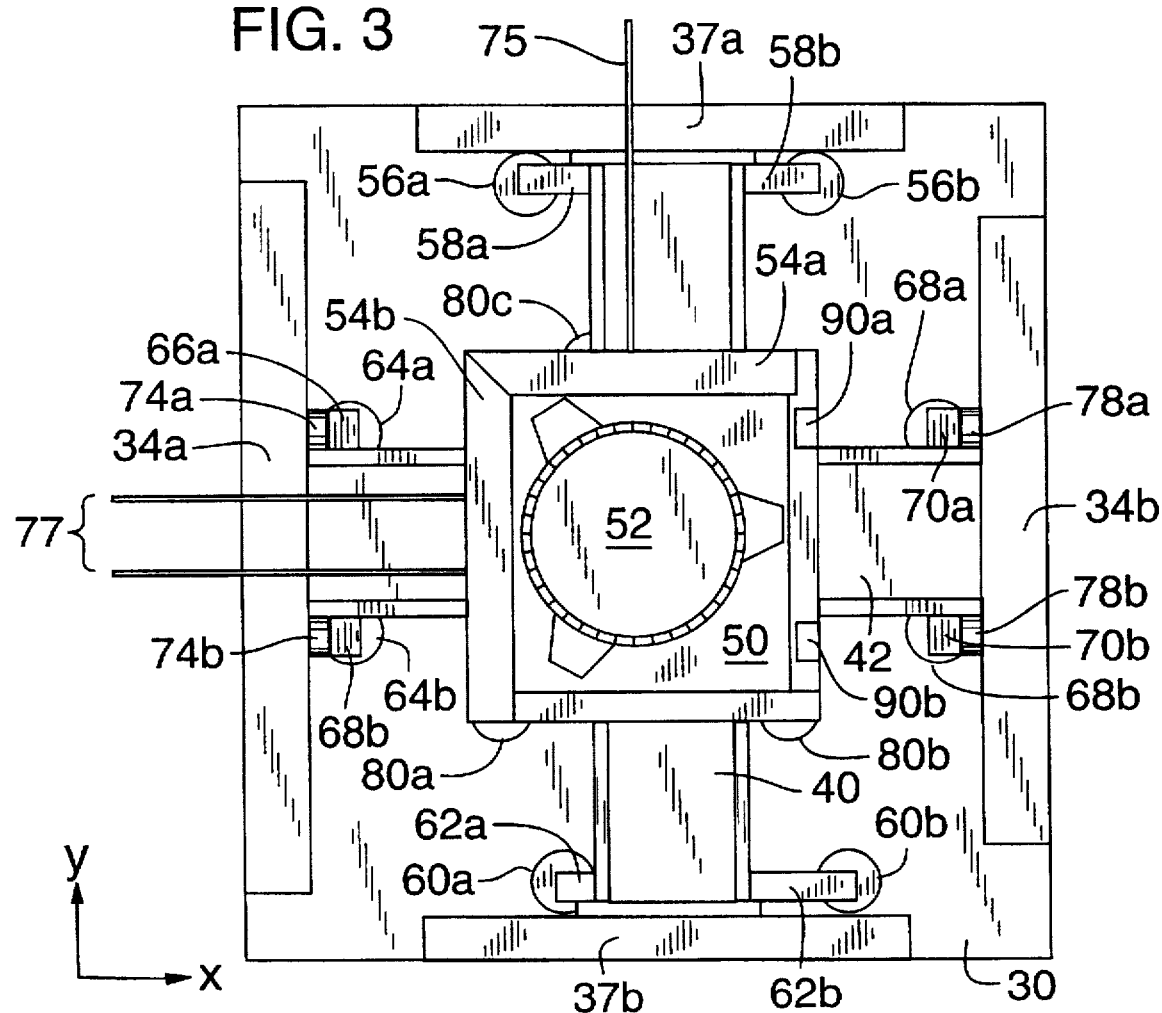
FIG. 3 shows a plan view of the mechanism of FIG. 2.

The structure of FIG. 2 is shown in a plan view in FIG. 3 with identical elements being labelled with identical reference numbers. In this embodiment, base 30 is about 100 cm (along the X-axis) by 120 cm. (along the Y-axis). Also depicted in FIG. 3 are the Y-axis laser beam 75 and the X-axis laser beams 77 (from lasers, not shown) respectively impinging on mirrors 54a and 54b for conventional interferometry location measurement purposes. Beam 75 monitors Y direction motion of stage 50, while two beams 77 monitor X direction and yaw motions of the stage. The yaw of X guide beam 40 is adjusted by applying appropriate electrical current to coils at the end of the x-beam.

Also shown is a small portion of the third air bearing 80c which supports the underside of stage 50, and the two air bearings 60a and 60b for supporting (on base 30) the lower end of X guide beam 40 and mounted respectively on supports 62a and 62b which are respectively 40 millimeters and 150 millimeters long. Again, these supports are for purposes of clearance with respect to the air bearings 80a, 80b, 80c.

Additional air bearings of the structure of FIG. 2 are depicted in the plan "x-ray" view of FIG. 4 which otherwise is identical to FIG. 3. (FIG. 4 is not a usual cross-sectional view but instead depicts the structure at all cross-sections to illustrate each air bearing.) Amongst the additional elements shown in FIG. 4 is air bearing 100a mounted on the upper end of X guide beam 40 and bearing against stationary guide 32a. Similarly air bearing 100b which bears against stationary guide 32b is mounted on the lower end X guide beam 40. Air bearing 102 is located on the underside of the (lower) Y guide beam 42 to support the central portion of guide beam 42 on base 30, hence allowing guide beam 42 to be weaker (lighter).

Additionally shown are conventional adjustment devices 90a, 90b for fine horizontal positioning (along the X axis) of chuck 52. Other well known elements conventionally present on a photolithography wafer stage are not illustrated, for simplicity.

X guide beam 40 and Y guide beam 42 are each formed e.g. of ceramic material (alumina). In one embodiment, X guide beam 40 and Y guide beam 42 are each approximately 90 cm. long, 20 cm. wide, and 6 cm. thick. Stage 50 measures approximately 38 cm. by 38 cm. in plan view and is approximately 18 cm. high, not counting base 30. This provides in one embodiment a maximum movement of stage 50 of about 25 cm. by 25 cm.

The air bearings affixed to the ends of each guide beam 40 and 42 are located as close to the neutral axis of each guide beam as possible to reduce undesirable torque moments on the guide beam, which may cause rolling or pitching of the guide beam. This may in turn adversely influence the main stage. (The neutral axis is that about which the guide beam bends.) Furthermore, for each air bearing a minimum force is applied to stabilize the associated guide beam in its axial direction.

It is to be understood that fluid bearings other than air bearings may be used. For instance, helium type bearings may be used. For a non-semiconductor application, a system that may operate in less clean environments may use oil or water bearings. It is also possible to use magnetic bearings, whereby the clearance between the moving part and stationary parts is maintained by a magnetic field. This type of bearing is described in U.S. Patents: U.S. Pat. No. 5,196,745, Magnetic Positioning Device, to Trumper; U.S. Pat. No 4,684,315, Frictionless Supporting Apparatus, to Sugishima; and U.S. Pat. No. 4,952,858, Microlithographic Apparatus, to Galburt.

Stage 50 is located at the intersection of the guide beams 40 and 42. X guide beam 40 overlies the Y guide beam 42 and moves in the X axis direction along the X direction stationary guides 32a, 32b. Guide beam 40 is supported by air bearings 56a and 56b and two other air bearings not shown. Both the X guide beam 40 and the Y guide beam 42 define vertical guide surfaces on their sides, and their outer portions thereby engage air bearings mounted on the stage 52.

The X guide beam 40 is allowed to move slightly in the Y direction and also in the yaw direction (i.e. in rotation about the Z axis which is perpendicular to the surface of the chuck 52) by single air bearing 100a (FIG. 3) mounted rigidly at the upper end of the X guide beam 40, and single spring mounted air bearing 100b mounted at the other end of X guide beam 40 in order to load bearing 100a. This "pre-loading" bearing 100b is spring mounted on guide beam 40, e.g. mounted to guide beam 40 on a metal flexure (leaf spring) to allow X guide beam 40 to deviate from precise parallelism and yet provide a constant force against bearing 100a, thereby providing constant performance across the stroke of travel of guide beam 40. This loading may be relatively small, resulting in a relatively low overall stiffness of the bearing 100a. This loading in turn reduces the Y direction and yaw precision of the X guide beam 40. However, the loading does not degrade performance of the stage mechanism because the stage 50 is in contact with the X guide beam 40 only through air bearings (as described below) acting in the X direction.

In other embodiments, two preloading bearings 100b are used, symmetrically disposed at the end of guide beam 40 but as close to the neutral axis as possible. In one embodiment, the spring exerts about 20 to 90 Kg of preload. Instead of a simple flexure spring mounting, the bearing 100b may be gimbal mounted on the flexure for greater freedom of movement, using e.g. a ball and socket mount.

Similarly there is a constraint between the Y guide beam 42 and the associated stationary guides 34a, 34b to allow yaw control of Y beam 42. Thus Y guide beam 42 is constrained by the respective stationary guides 34a, 34b to allow motion in the Y direction. Y guide beam 42 is constrained in the X and yaw directions. This is accomplished by locating two air bearings 74a, 74b and 78a, 78b respectively at each end of guide beam 42. In order to reduce the possibility of over-constraint, in one embodiment the bearings 74a, 74b at one end of guide beam 42 are spring mounted by flexures to their supports 66a, 66b. In one embodiment these air bearings are spring and gimbal mounted (as described above for air bearing 100b). In contrast, the air bearings 78a, 78b at the other end of Y guide beam 42 are rigidly mounted to their respective supports 66a, 66b. Thus the spring mounted bearings 74a, 74b preload bearings 78a, 78b.

The X guide beam 40 position is adjustable in the yaw direction by differentially driving the linear motor coils which (as described above) are located at each end of X guide beam 40. This differential driving of the two motor coils compensates for any "torquing" of the X guide beam 40 due to the location of the stage 50 on the guide beam 40. The differential drive is achieved by a conventional computer program resident in a controller in the control circuit for the motor coils. The computer program receives data as to the location of the stage 50 on guide beam 40 and, in accordance with predetermined data on the stage configuration, supplies varying amounts of current to the two motor coils. As discussed above in conjunction with the Y guide beam 42, while the overall stiffness of the X guide beam 40 bearings in the Y direction is low, this will not directly effect the performance of the stage 50, since the connection of the stage 50 to the X guide beam 40 is not sensitive to small Y direction motions of X guide beam 40.

Additionally there is an air bearing constraint between the X guide beam 40 and stage 50. Thus stage 50 is guided by the vertical right side of X guide beam 40 through air bearings 82a, 84a which are preloaded by opposing spring mounted air bearings 82b, 84b mounted on the opposite (left) side of X guide beam 40. Movement of the stage 50 is constrained in the Y direction by bearings 85a, 85b (see FIG. 4) which are in contact with the vertical sides of Y guide beam 42. One of these bearings 85a, 85b can be spring mounted to allow for greater yaw adjustment of the stage 50. In one embodiment, the stage 50 is adjusted in yaw while the Y guide beam 42 is held fixed in yaw. The Y guide beam 42 is used to determine only the Y direction position of the stage 50. Both bearings 85a, 85b are in one embodiment also mounted on a gimbal to allow yaw motion between stage 50 and Y guide beam 42. Thus stage 50 is free to move in the yaw direction even though Y guide beam 42 is fixed in the yaw direction.

Alternatively, other preloading mechanisms are used for the guide beams and stage, such as a vacuum or magnetic preload system whereby vacuum sources or magnets located adjacent the air bearings pull together the two surfaces that the air bearings are otherwise holding apart.

This bearing mechanism renders stage 50 insensitive to motion of X guide beam 40 in the Z and Y directions, but allows the stage to follow the X guide beam 40 in the X and yaw directions. Thus any over-constraints between X guide beam 40 and its stationary guides 32a, 32b and between X guide beam 40 and the stage 50 are minimized without reducing stage performance in terms of precision location.

Having two stationary guides at each end of the guide beams as described above is not required. A second embodiment with only a single stationary guide at one end of each beam is shown in FIG. 5.

Referring to FIG. 5, sliding on base 130 against fixed guides 134, 137 are air bearing assemblies with bearings 174a, 174b, 178a, 178b, 200a, 200b, 200c, 200d. Y guide beam 142 is constrained in the yaw direction while X guide beam 140 is not. Stage 150 is connected to guide beams 140, 142 as described above. The pivot hinge 214 allows the X guide beam 140 to move in the yaw direction, thus enabling the stage 150 to move accordingly. Guide beams 140, 142 are moved using motor coils 210a, 210b, 212a, 212b driven as described above in corresponding magnetic tracks (not shown).

A pivot hinge 214 or equivalent pivot connection may be placed between the air bearing assembly that includes air bearings 174a, 174b, 178a, 178b, and the Y guide beam 142. Y guide beam 142 is allowed to move in the yaw direction but such motion would not cause the stage 150 to yaw. An independent yaw measuring device (not shown) is included to monitor and control the yaw deflection of the Y guide beam 142. For example, two laser beams extending in the Y direction, and spaced apart in the X direction could directly monitor the yaw of Y guide beam 142.

The above description is illustrative and not limiting; further modifications will be apparent to one of ordinary skill in the art in the light of the above description and are intended to fall within the scope of the appended claims.

I claim:

1. A stage mechanism, comprising:

a base;

a first guide on said base;

a second guide on said base and being oriented at an angle to said first guide;

a first guide member in slidable contact with said first guide;

a second guide member, lying at an angle to said first guide member and in slidable contact with said second guide; and a stage adjacent said first and second guide members;

wherein a first end of said first guide member slides in a rigid relation to said first guide, and a first end of said second guide member slides in a non-rigid relation to said second guide, thereby allowing yaw motion of said second guide member, and said stage is laterally and rotatably positioned by said first and second guide members.

2. The stage mechanism of claim 1, wherein said second guide member is pivotally held in contact with said second guide.

3. The stage mechanism of claim 1, further comprising third and fourth guides, said third guide being fixed on said base spaced apart and parallel to said first guide, said fourth guide being fixed on said base spaced apart and parallel to said second guide, wherein a second end of said first guide member is in sliding contact with said third guide and a second end of said second guide member is in sliding contact with said fourth guide.

4. The stage mechanism of claim 1, wherein said stage is movably positioned in at least three degrees of freedom including in directions defined by said first and second guides and in a yaw direction by said first and second guide members.

5. The stage mechanism of claim 3, further comprising:

at least one bearing rigidly mounted on said first end of said first guide member thereby to maintain said rigid relation; and at least one bearing flexibly mounted on said second end of said first guide member thereby to maintain said non-rigid relation and allowing yaw motion of the first guide member.

6. The stage mechanism of claim 3, wherein a second end of said first guide member slides in a non-rigid relation to said third guide, and a second end of said second guide member slides in a rigid relation to said fourth guide.

7. The stage mechanism of claim 5, wherein each of said bearings is a fluid bearing.

8. The stage mechanism of claim 5, wherein each of said bearings is a non-contact bearing.

9. The stage mechanism of claim 1, further comprising a plurality of bearings mounted on an under surface of said stage and confronting said base.

10. The stage mechanism of claim 3, further comprising at least two spaced apart bearings rigidly mounted on said first end of said second guide member and at least one bearing flexibly mounted on said second end of said guide member.

11. The stage mechanism of claim 1, wherein said stage defines a first opening through which said first guide member passes and a second opening through which said second guide member passes, and further comprising a first stage bearing mounted on a portion of said stage defining said first opening and a second stage bearing mounted on said stage and located opposing said first bearing, whereby said first and second bearings confront said first guide member.

12. The stage mechanism of claim 3, further comprising two linear motors, each associated with one end of said second guide member, each linear motor including a coil mounted in one end of said guide member and a co-operating magnet track mounted adjacent said second and fourth guides;

wherein said two linear motors are driven differentially.

13. The stage mechanism of claim 1, further comprising a plurality of bearings mounted to said first guide member and confronting said base, thereby allowing said first guide member to slide on said base.

14. A stage mechanism, comprising:

a base having a flat surface;

a first guide fixed on said surface of said base;

a second guide fixed on said surface of said base and being at a right angle to said first fixed guide;

a first guide member rigidly movable in a first direction defined by said second fixed guide so as to restrict a yaw-motion of said first movable member;

a second guide member non-rigidly movable in a second direction defined by said first fixed guide so as to allow a predetermined amount of yaw-motion of said second guide member; and a stage movable in said first and second directions on said surface of said base and guided by said first and second guide members, thereby to allow the predetermined amount of yaw-motion by said movable stage.

* * * * *